United States Patent [19]

Wada et al.

[11] 4,282,448

[45] Aug. 4, 1981

[54] MONOSTABLE MULTIVIBRATOR AND FM DETECTOR CIRCUIT EMPLOYING COMMON EMITTER TRANSISTOR AMPLIFIER WITH PLURAL EMITTER RESISTORS TO AVOID CIRCUIT OPERATION FROM SIGNAL NOISE

[75] Inventors: Takeshi Wada; Masanori Ienaka, both of Kodaira; Yasuo Kominami, Kokubunji; Yukihiko Miyamoto; Tsuneo Yamada, both of Tokyo, all of Japan

[73] Assignees: Hitachi, Ltd.; Trio Kabushiki Kaisha, both of Tokyo, Japan

[21] Appl. No.: 969,085

[22] Filed: Dec. 13, 1978

[30] Foreign Application Priority Data

Mar. 15, 1978 [JP] Japan .................... 53-28658

[51] Int. Cl.³ ............... H03K 3/033; H03K 17/16
[52] U.S. Cl. ................... 307/273; 329/128; 307/542; 307/246; 330/254
[58] Field of Search ............ 307/273, 254, 246; 330/254; 329/128, 237, 542

[56] References Cited

U.S. PATENT DOCUMENTS

| | | | |
|---|---|---|---|
| 3,124,706 | 3/1964 | Alexander | 307/273 X |
| 3,140,446 | 7/1964 | Myers et al. | 307/273 X |
| 3,143,658 | 8/1964 | Woods et al. | 307/273 X |
| 3,193,706 | 7/1965 | Creamer et al. | 307/273 X |
| 3,435,362 | 3/1969 | Pamlenyi | 330/254 |
| 3,883,756 | 5/1975 | Dragon | 307/273 X |
| 4,009,404 | 2/1977 | Kuo | 307/273 |
| 4,134,078 | 1/1979 | Arai et al. | 330/254 |

*Primary Examiner*—John S. Heyman
*Attorney, Agent, or Firm*—Craig and Antonelli

[57] ABSTRACT

This invention discloses a monostable multivibrator which is useful for an FM detector circuit of a pulse count system. The monostable multivibrator has a time constant circuit which includes a capacitor, an amplifier circuit which receives an output of the time constant circuit, a positive feedback circuit which is connected between an output end of the amplifier circuit and an input end of the time constant circuit, and a trigger terminal which is disposed in a circuit loop constructed of the time constant circuit, the amplifier circuit and the positive feedback circuit; and is characterized in that the amplifier circuit is a differential amplifier which is made up of a pair of transistors connected in the differential form, the transistors being connected in common through emitter resistances connected in series with respective emitters thereof. Thus, the monostable multivibrator can provide pulse signals of a fixed pulse width without being influenced by noise.

5 Claims, 10 Drawing Figures

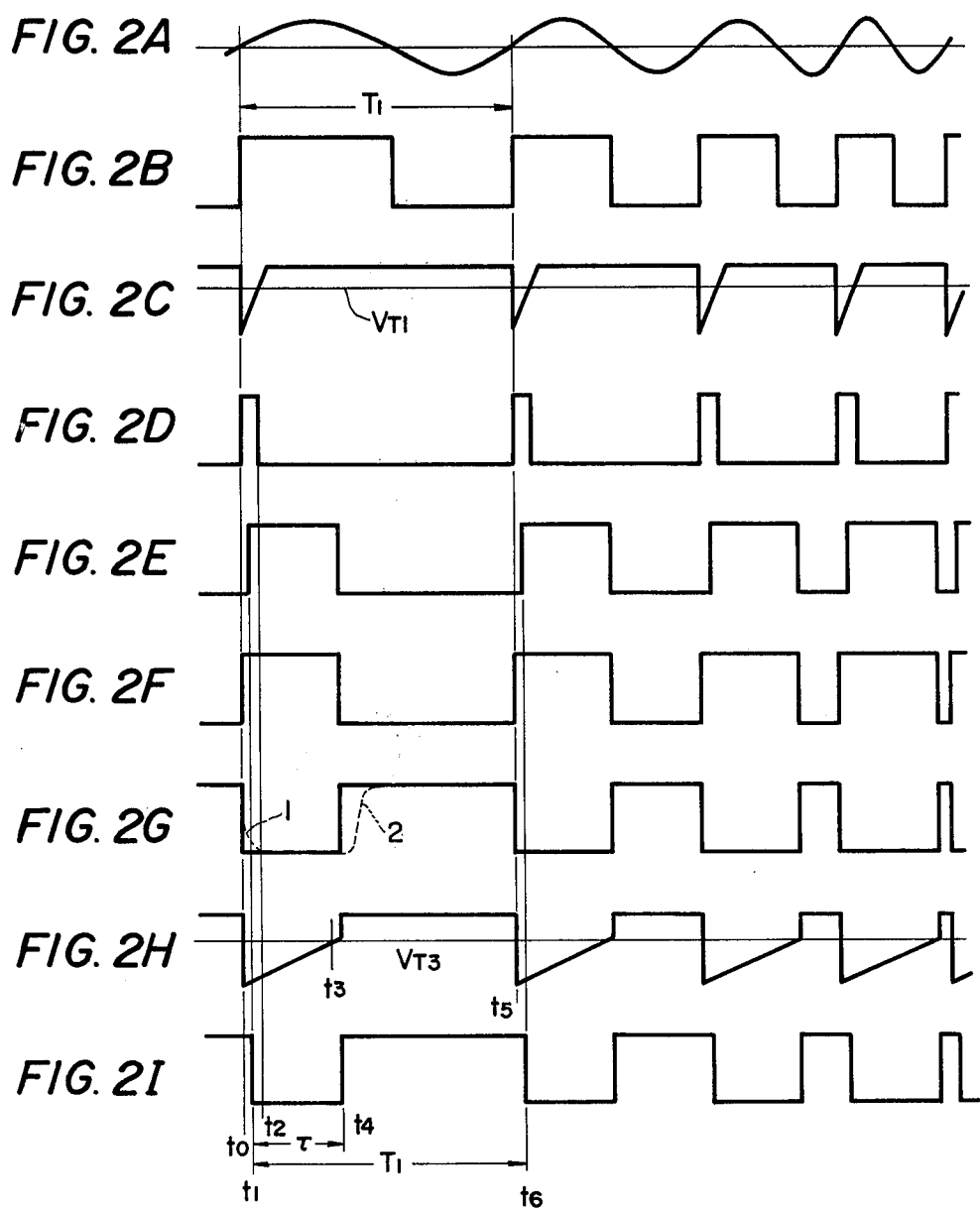

MONOSTABLE MULTIVIBRATOR AND FM DETECTOR CIRCUIT EMPLOYING COMMON EMITTER TRANSISTOR AMPLIFIER WITH PLURAL EMITTER RESISTORS TO AVOID CIRCUIT OPERATION FROM SIGNAL NOISE

BACKGROUND OF THE INVENTION

This invention relates to monostable multivibrator circuits, and more particularly to a monostable multivibrator circuit for use in an FM detector circuit of a pulse count system.

A monostable multivibrator circuit usually has a time constant circuit which includes a capacitor, an amplifier circuit which receives an output from the time constant circuit and which has an input threshold voltage, a positive feedback circuit which is connected between an output end of the amplifier circuit and the time constant circuit, and a trigger terminal which is disposed in a circuit loop constructed of the time constant circuit, the amplifier circuit and the positive feedback circuit.

The output pulse width of this circuit is determined by a period of time during which the output signal level of the time constant circuit exceeds the input threshold voltage.

The inventors constructed a monostable multivibrator by employing differential amplifier transistors for the amplifier circuit and the positive feedback circuit. As a result, it has become possible to determine the input threshold voltage by a potential which is applied to the base of one of a pair of transistors of the differential amplifier. In this case, the input threshold voltage is decided by the external potential, not by the characteristic of an element itself as in the case of, for example, utilizing the base-emitter voltage of a transistor. Therefore, the input threshold voltage can be freely set and can be made a stable value without being influenced by a variation in the characteristic of the element itself.

Moreover, it has become possible to operate the differential amplifier transistor in the non-saturated state in such a way that the quantity of a voltage drop to appear in a collector load is limited by the current of a current source connected to the emitter of the transistor. Therefore, the lowering of a current gain and the accumulation of carriers in a collector region or a base region which are attributed to the saturated operation of the transistor do not occur, and an output signal of comparatively good waveform and quick response can be obtained.

Further, experiments and studies, however, have revealed that, in the monostable multivibrator employing the differential amplifier transistors as described above, the operation resetting time is susceptible to influences of noise, so that the output pulse width is not fixed.

SUMMARY OF THE INVENTION

It is accordingly an object of this invention to provide a monostable multivibrator circuit which employs differential amplifier transistors and whose output pulse width is kept fixed.

Another object of this invention is to provide an FM detector circuit of a pulse count system which employs a monostable multivibrator.

According to this invention, a differential amplifier circuit is used as an amplifier circuit which receives an output from a time constant circuit in a monostable multivibrator, and emitter resistors of a comparatively small resistance value are connected to the emitters of differential amplifier transistors of the amplifier circuit.

Hereafter, an embodiment of this invention will be described in detail with reference to the drawings.

BRIEF DESCRIPTION OF THE DRAWINGS

FIGS. 2A to 2I are diagrams of operating waveforms in the embodiment of this invention shown in FIG. 1.

DESCRIPTION OF THE PREFERRED EMBODIMENT

Figure 1:
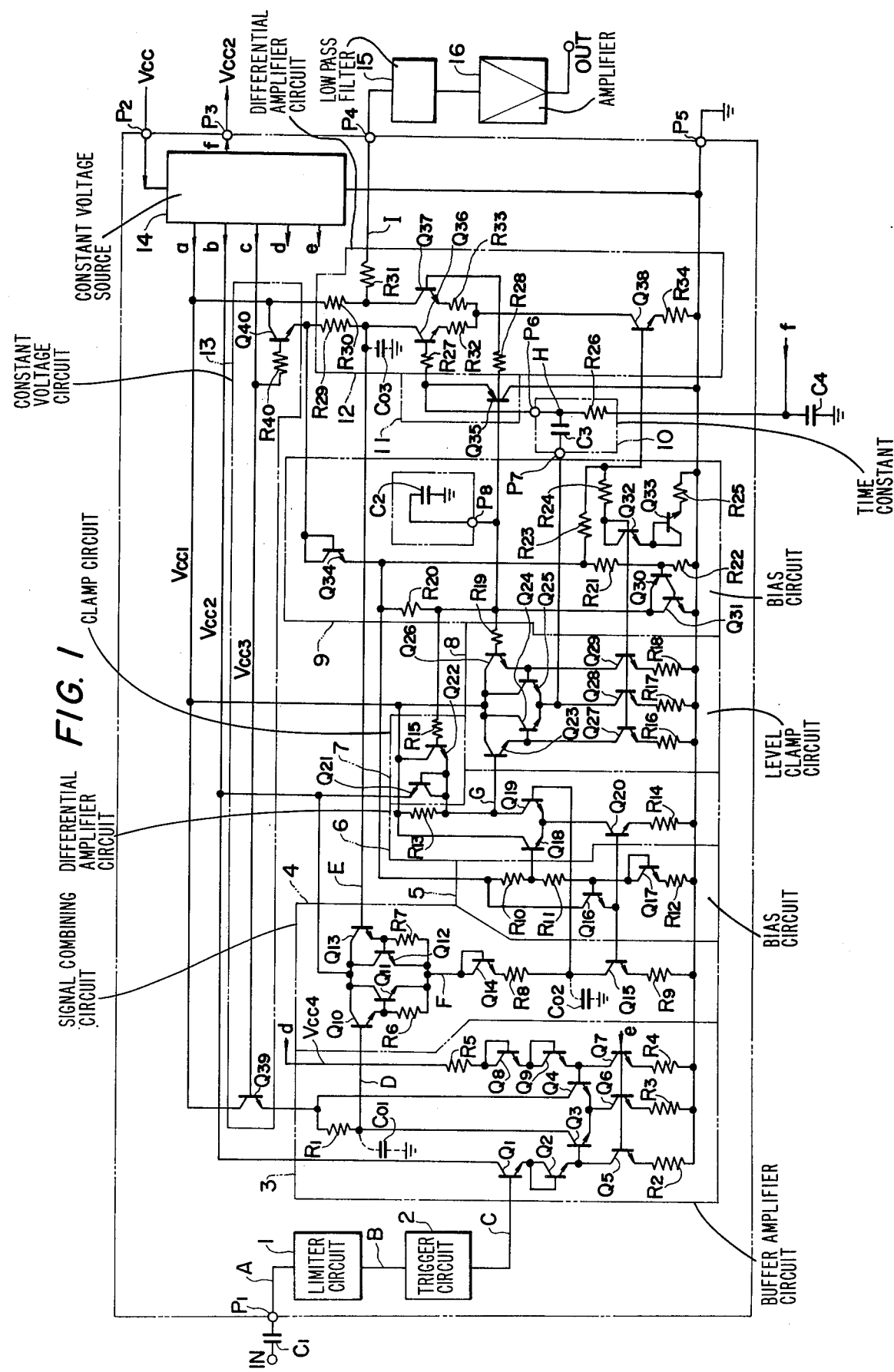
FIG. 1 is a circuit diagram showing an embodiment in the case where a monostable multivibrator in this invention is applied to an FM detector circuit of the pulse count system.

The monostable multivibrator of this invention is effective when applied to an FM detector circuit of the pulse count system. In the following description, therefore, an embodiment of the FM detector circuit of the pulse count system will be referred to. The FM detector circuit of the pulse count system forms pulses of fixed width synchronous with the phases of the respective periods of a modulated signal, and integrates them into a detection output. As an expedient for producing the pulses of fixed width, it is effective to employ the monostable multivibrator of this invention which will now be stated.

FIG. 1 shows the monostable multivibrator circuit of this invention in the state in which it is used in an FM detector circuit of the pulse count system.

Referring to the figure, numeral 1 designates a limiter circuit, numeral 2 a trigger signal forming circuit, numeral 3 a buffer amplifier circuit which executes an amplitude limiting operation, and numeral 4 a signal combining circuit. Numerals 5 and 9 designate bias supplying circuits, and numerals 6 and 12 differential amplifier circuits. Numeral 7 indicates a level clamp circuit, numeral 8 a differentiator driver and level clamp circuit, numeral 10 a time constant circuit, and numeral 11 a differentiator output clamp circuit. Shown at 13 and 14 are constant-voltage circuits.

In the above, the circuits 4 to 12 constitute the monostable multivibrator circuit.

A portion enclosed with a one-dot chain line in the figure is put into a semiconductor integrated circuit (IC). $P_1$ to $P_5$ represent external terminals of the IC.

Signal waveforms at positions A to I in the circuit are respectively illustrated in FIGS. 2A to 2I.

An FM signal which has been broadcast and received and which has been converted into an intermediate frequency of comparatively low frequency is applied to the terminal $P_1$ through a terminal IN as well as a coupling capacitor $C_1$.

This FM signal is waveform-shaped by the limiter circuit 1 in order to obtain a trigger signal later. The limiter circuit 1 amplifies the input FM signal shown in FIG. 2A, and limits the amplitude of the amplified signal. As illustrated in FIG. 2B, the output signal of the limiter circuit 1 becomes a substantially rectangular signal waveform having the same periods as those of the input FM signal.

The trigger signal forming circuit 2 includes, for example, a waveform shaping circuit composed of resistors and capacitors and an amplifier circuit (neither is shown in the figure). In response to the input rectangular wave signal in FIG. 2B, it provides the trigger signal in synchronism with the rise of the input signal. The output signal waveform of the circuit 2 assumes the shape illustrated in FIG. 2C.

The trigger signal is applied to the buffer amplifier circuit 3. In the buffer amplifier circuit 3, transistors $Q_5$ to $Q_7$ operate as constant-current transistors owing to a base bias voltage fed from the constant-voltage circuit 14.

The trigger signal is applied to the base of one differential transistor $Q_3$ through an emitter follower transistor $Q_1$ and a level shifting transistor in the diode connection $Q_2$ which are connected in series. The quantity of level shift by the transistors $Q_1$ and $Q_2$ is constant because their emitter currents are fixed by the transistor $Q_5$.

An output voltage $V_{CC4}$ of the constant-voltage circuit 14 is applied to the base of the other differential transistor $Q_4$ through a resistor $R_5$ and diode-connected transistors $Q_8$ and $Q_9$ which are connected in series.

The base potential $V_{T1}$ of the other differential transistors $Q_4$ is set at an intermediate value in the level variation range of the trigger signal which is applied to the one differential transistor $Q_3$. The one differential transistor $Q_3$ conducts the "on-off" operation with its threshold voltage being the potential $V_{T1}$.

In response to the input trigger signal shown in FIG. 2C, accordingly, the buffer amplifier circuit 3 provides an inverted signal which is waveform-shaped into a fixed amplitude and duration as illustrated in FIG. 2D.

The trigger signal subjected to the waveform shaping and a feedback signal from the differential amplifier circuit 12 are applied to the signal combining circuit 4.

Transistors $Q_{10}$ and $Q_{11}$ and transistors $Q_{12}$ and $Q_{13}$ of the signal combining circuit 4 are Darlington connected, respectively. The emitters of the transistors $Q_{11}$ and $Q_{12}$ are connected in common, and are connected to the collector of a constant-current transistor $Q_{15}$ through a level shifting transistor in the diode connection $Q_{14}$ and a resistor $R_8$.

The transistors $Q_{10}$ and $Q_{11}$ and those $Q_{13}$ and $Q_{12}$ in the Darlington connections operate as a kind of switching element for two input signals owing to the common connection of the emitters. The potential of the emitters connected in common corresponds to a higher one of the base potentials of the transistors $Q_{10}$ and $Q_{13}$. The transistors in the Darlington connection operate also as a level shift circuit. The quantity of level shift which occurs between the base and the common emitter of the Darlington-connected transistors in the "on" state is equal to the sum of the base-emitter forward voltages of the two transistors. In this case, the emitter current is made constant by the constant-current transistor $Q_{15}$, and hence, the base-emitter forward voltage is constant. Accordingly, the aforecited quantity of level shift is constant irrespective of the level of the input signal applied to the base of the Darlington-connected transistor.

In the circuit of FIG. 1, the signal shown in FIG. 2D is applied to the base of the Darlington-connected transistor $Q_{10}$, and the feedback signal shown in FIG. 2E is applied to the base of the transistor $Q_{13}$. Therefore, a composite signal shown in FIG. 2F appears at the common-connection emitters.

The composite signal is applied to the differential amplifier circuit 6 through a level shift circuit which consists of the diode-connected transistor $Q_{14}$ and the resistor $R_8$. The differential amplifier circuit 6 consists of differential transistors $Q_{18}$ and $Q_{19}$, a constant-current transistor $Q_{20}$ and a load resistor $R_{13}$, and it inverts and amplifies the entered composite signal. An output signal at an output terminal of the differential amplifier circuit 6 has its high level and low level limited by the clamp circuit 7. Since, in the clamp circuit 7, the emitter of a transistor $Q_{21}$ is connected to an output terminal b of the constant-voltage circuit 14, the high level is determined by a voltage $V_{CC2}$ and the base-emitter forward voltage of the transistor $Q_{21}$. Since the base of a transistor $Q_{22}$ receives a constant voltage from the bias supplying circuit 9 through a resistor of comparatively small resistance $R_{15}$, the low level is determined by the constant voltage and the base-emitter forward voltage of the transistor $Q_{22}$. The voltage $V_{CC2}$ has a value lower than a supply voltage $V_{CC1}$ of the differential amplifier circuit 6. The low clamp level owing to the transistor $Q_{22}$ is made a comparatively high level lest the collector potential of the differential transistor $Q_{19}$ should become lower than the base potential thereof.

The differential amplifier circuit 6 provides an inverted signal as shown in FIG. 2G at its output terminal in response to the input signal shown in FIG. 2F.

The changing rate of the output signal of the differential amplifier circuit 6 at the rise thereof is limited by the time constant between the load resistor $R_{13}$ and an output capacitance (not shown) including the collector capacitance of the transistor $Q_{19}$, a wiring capacitance, etc. In particular, the changing rate decreases as the potential of the output terminal becomes closer to the supply voltage $V_{CC1}$.

The portion of the low rate of change is removed from the output signal by the clamping of the high level of the output signal.

The differential transistor $Q_{19}$ operates in the non-saturated state because the lower limit of its collector potential is set by the clamp circuit 7. Accordingly, it operates at a high speed. In contrast, in case where the lower limit of the collector potential is not set, the transistor $Q_{19}$ will operate in the saturated state when the collector potential has become lower than the base potential in response to the input signal. Since the current gain of the transistor becomes small in the saturated state, the output signal waveform will become rounded as indicated by a broken line 1 in FIG. 2G. Besides, it lags as indicated by a broken-line curve 2 in FIG. 2G on account of the accumulation of carriers in the base and the collector.

The output signal of the differential amplifier circuit 6 is applied to the differentiator driver circuit which has emitter-follower transistors $Q_{23}$ and $Q_{24}$ in the Darlington connection. The differentiator driver circuit has a clamp circuit which is composed of transistors $Q_{25}$ and $Q_{26}$. The lower-limit level of the emitter potential of the transistor $Q_{24}$ is limited by this clamp circuit.

An output signal from the buffer amplifier circuit 8 is applied through an external terminal $P_7$ to the time constant circuit 10 which is composed of a capacitor $C_3$ and a resistor $R_{26}$. An output signal from the time constant circuit is applied to the differential amplifier circuit 12 through an external terminal $P_6$ as well as the differentiator output clamp circuit 11.

One end of the resistor $R_{26}$ of the time constant circuit 10 is connected to a smoothing capacitor $C_4$ and an output terminal f of the constant-voltage circuit 14. In the stable state of the monostable multivibrator circuit, the base-emitter path of a p-n-p transistor $Q_{35}$ of the differentiator output clamp circuit 11 is forward-biased by a current from the resistor $R_{26}$. Accordingly, the emitter potential of the transistor $Q_{35}$ is higher than the base potential thereof. Owing to the aforecited potentials of the differentiator output clamp circuit 11, a transistor $Q_{36}$ of the differential amplifier circuit 12 is in the "on" state and a transistor $Q_{37}$ thereof is in the "off" state.

The time constant circuit 10 provides a signal shown in FIG. 2H.

The differential amplifier circuit 12 is made up of the differential amplifier transistor $Q_{36}$ and $Q_{37}$, load resistors $R_{29}$ and $R_{30}$, resistors of comparatively small resistance $R_{27}$ and $R_{28}$ connected to the bases of the transistors and serving to stabilize the circuit operation, emitter resistors $R_{32}$ and $R_{33}$, and a constant-current transistor $Q_{38}$.

In the differential amplifier circuit 12, the constant-current transistor $Q_{38}$ limits by its collector current the quantity of voltage drop across the load resistor $R_{29}$ or $R_{30}$ connected through the differential amplifier transistor $Q_{36}$ or $Q_{37}$. As a result, the differential amplifier transistor $Q_{36}$ or $Q_{37}$ has its collector potential made higher than its base potential and operates in the non-saturated state.

The differential amplifier circuit 12 receives the signal shown in FIG. 2H, and delivers a signal shown in FIG. 2I to an output terminal I.

In the bias supplying circuit 9, a capacitor $C_2$ which is disposed between a terminal $P_8$ and an earth point of the circuit serves for smoothing.

In the arrangement described above, on the basis of the rise of the trigger signal shown in FIG. 2D which is applied to the base of the transistor $Q_{10}$ of the signal combining circuit 4, the input signal of the time constant circuit 10 falls at a time $t_0$, and the output signal thereof falls upon the decay of this input signal.

Owing to the output signal of the time constant circuit 10, the base potential of the transistor $Q_{36}$ of the differential amplifier circuit becomes lower than the base potential of the transistor $Q_{37}$, so that the transistor $Q_{36}$ changes from the "on" state of the "off" state and the transistor $Q_{37}$ from the "off" state of the "on" state. Accordingly, the collector potential of the transistors $Q_{36}$ becomes the high level. The potential of this high level is supplied to the combining circuit 4. In consequence of a feedback through the circuits 4, 6 and 8, the input signal of the time constant circuit 10 remains at the low level as long as the transistor $Q_{36}$ of the differential amplifier circuit 12 is in the "off" state.

The capacitor $C_3$ of the time constant circuit 10 is charged through the resistor $R_{26}$ from the constant-voltage circuit 14. Therefore, the potential of the output terminal of the time constant circuit 10 increases as shown in FIG. 2H according to a time constant thereof.

The base potential of the transistor $Q_{36}$ of the differential amplifier circuit 12 exceeds the base potential of the transistor $Q_{37}$ at a time $t_3$ owing to the output potential of the time constant circuit 10.

As a result, the transistor $Q_{36}$ returns to the "on" state again. Upon the increase of the collector potential of the transistor $Q_{36}$, the input signal of the time constant circuit 10 rises at a time $t_4$ through the circuits 4, 6 and 8.

Upon the rise of the input signal of the time constant circuit 10, the output signal thereof rises. In this case, the output signal is limited by the transistor $Q_{35}$ because the base-emitter path of the transistor $Q_{35}$ of the differentiator output clamp circuit 11 is forward-biased by this signal. Since the emitter terminal of the transistor $Q_{35}$ comes to exhibit a sufficiently low impedance, charges stored in the capacitor $C_3$ of the time constant circuit 10 are rapidly discharged through the transistor $Q_{35}$.

The monostable multivibrator circuit consisting of the circuits 4 to 12 conducts the same operation as above described in response to the next trigger signal.

In the circuit of FIG. 1, the monostable multivibrator circuit provides a pulse signal of a fixed duration $\tau$ as indicated in FIG. 2I every period of the FM signal shown in FIG. 2A.

This signal is impressed on the terminal $P_4$ and a low-pass filter circuit 15. A demodulated signal is obtained from the low-pass filter circuit 15. The demodulated signal is amplified by an amplifier circuit 16.

In the above circuit arrangement, the operation resetting time is stabilized due to the insertion of the emitter resistors $R_{32}$ and $R_{33}$, with the result that the output pulse width becomes constant.

As the reason for the beneficial result that the pulse width becomes constant as described above, the following is considered.

The operaticn starting time of the monostable multivibrator circuit is decided by the trigger signal. In this case, the trigger signal changes at a comparatively high speed, so that the operation starting time is scarcely influenced by noise.

On the other hand, the operation resetting time (the time at which the astable state is reset to the stable state) is decided by the time at which the output signal of the time constant circuit exceeds the input threshold voltage of the differential amplifier circuit 12. In this case, the output signal of the time constant circuit changes at a comparatively low speed, so that the time at which the level of the output signal exceeds the threshold voltage is varied comparatively greatly by noise.

Now, consider a case where this invention is not conformed with and where no emitter resistor is inserted for the transistors $Q_{36}$ and $Q_{37}$ of the differential amplifier circuit 12. The transfer characteristic of input voltage-versus-output current of the differential amplifier circuit 12 having neither the emitter resistor $R_{32}$ nor $R_{33}$ becomes abrupt, that is, the mutual conductance $g_m$ or gain becomes high. In such a differential amplifier circuit, consequently, the output signal of the differential amplifier circuit 12 (the collector output signal of the transistor $Q_{36}$) is inverted by an input signal which changes in a slight magnitude and which is applied to one input terminal (the base of the transistor $Q_{36}$) of the differential amplifier circuit with respect to a reference voltage level ($V_{T3}$) bestowed on the other input terminal (the base of the transistor $Q_{37}$). Accordingly, in case where a noise component or a jitter component is superposed on the slope part of the input signal shown in FIG. 2H, the collector output signal of the transistor $Q_{36}$ of the differential amplifier circuit 12 is undesirably inverted by the noise component or the jitter component at the time when the input signal has changed to the vicinity of the reference level $V_{T3}$. In consequence, the monostable multivibrator is reset from the astable state to the stable state at the undesired time. In this manner, the monostable multivibrator might be reset at a time before the predetermined reset time $t_4$ as indicated by way of example in FIG. 2I, and it might provide an undesired pulse signal having a pulse width smaller than the normal pulse width $\tau$.

In contrast, in case where the emitter resistors $R_{32}$ and R HD 33 are inserted in conformity with this invention, the transfer characteristic of the differential amplifier circuit 12 is made gentle so that the mutual conductance $g_m$ or gain may become low. Accordingly, even when the noise component is superposed on the input signal which is applied to the base of the transistor $Q_{36}$ of the differential amplifier circuit 12, this differential amplifier circuit undergoes no undesired inversion owing to the gentle transfer characteristic. Therefore, the monostable multivibrator is always reset at the predetermined time $t_4$ and can thus provide the pulse signal having the predetermined pulse width $\tau$ indicated in FIG. 2I.

In this way, according to the invention, the pulse signal of the fixed pulse width can be obtained without being affected by the noise component or the jitter component. Therefore, in case where the monostable multivibrator of this invention is applied to the FM detector circuit of the pulse count system, a detection output signal with little noise can be obtained. More specifically, the pulse signals always having the fixed pulse width $\tau$ as shown in FIG. 2I can be obtained in synchronism with the phases of the respective periods of the FM modulation signal as shown in FIG. 2A. Therefore, by integrating the pulse signals with the low-pass filter circuit 15, the transmitted voice signal can be reproduced at high fidelity.

In this embodiment, the trigger signal and the feedback signal are combined through the emitter-follower transistors, so that the electrical interference between the feedback signal terminal and the trigger signal terminal decreases to a negligible extent. Since the trigger terminal receives only the signal from the buffer amplifier circuit 3 and this signal does not undergo any level change due to the interference, the signal stably triggers the monostable multivibrator even in a different trigger period. The feedback terminal receives only the signal from the differential amplifier circuit 12, and this signal is not interfered with from the trigger terminal etc. Accordingly, the differential amplifier circuit 12 does not cause any distortion ascribable to the interference of the trigger signal.

In contrast, in case where, for example, the trigger terminal is interfered with by the feedback terminal, the level of the trigger terminal is at the high level during the period during which the level of the feedback terminal is at the high level, and it attains the low level when the feedback terminal has attained the low level. In this case, the change of the signal at the trigger terminal is limited by a stray capacitance $C_{01}$ of this trigger terminal, i.e., the output terminal of the buffer amplifier circuit, and hence, the signal level having appeared at the trigger terminal on account of the interference does not immediately decrease. As a result, when the trigger signal period differs, the trigger level changes because the signal level having been caused at the trigger terminal by the interference differs.

In this embodiment, the interference with the feedback terminal by the trigger terminal is diminished by the combining circuit as described previously. As illustrated in FIG. 1, the output terminal of the monostable multivibrator circuit is connected to the collector of the differential transistor $Q_{37}$, and it is separated from the feedback terminal. Accordingly, the trigger signal does not leak to the output terminal through the feedback terminal.

The emitter follower transistors of the combining circuit 4 have sufficiently low output impedances, and can accordingly make the rising rate of the composite signal sufficiently high. In case where the trigger terminal and the feedback terminal are directly connected, stray capacitances $C_{01}$ to $C_{03}$ including the collector capacitances of the transistors $Q_3$, $Q_{15}$ and $Q_{36}$, etc. will be combined at the direct connection point and will give a comparatively large value. The emitter follower transistors of the combining circuit 4 make the capacitances independent of one another. Therefore, the respective capacitances of the trigger terminal and the feedback terminal remain small, and the signal changes at these terminals can be made sufficiently rapid.

What is claimed is:

1. In a monostable multivibrator comprising:
    a time constant circuit which includes a capacitor;
    an amplifier circuit which comprises a pair of transistors whose emitters are coupled in common with each other a base of one of the pair of transistors being supplied with an output from said time constant circuit while a base of the other of the pair of transistors being supplied with a reference voltage so that the pair of transistors performs switching operation between "on" state and "off" state,
    a positive feedback circuit which is connected between an output end of said amplifier circuit and an input end of said time constant circuit; and
    trigger means coupled to a circuit loop constructed of said time constant circuit, said amplifier circuit and said positive feedback circuit the improvement comprising emitter resistances for decreasing the gain of said amplifier circuit inserted between the junction of the common coupling and the respective emitters of said pair of transistors.

2. A monostable multivibrator according to claim 1, wherein said amplifier circuit has a pair of output terminals connected to collectors of said pair of transistors, one of said output terminals is coupled to said positive feedback circuit while an output of said monostable multivibrator is derived from the other output terminal.

3. A monostable multivibrator according to claim 1, wherein a collector of said one transistor is coupled to said positive feedback circuit while an output of said monostable multivibrator is derived from a collector of said other transistor.

4. A monostable multivibrator according to any of claims 2 or 3, wherein said positive feedback circuit includes a differential amplifier, which receives an output of said amplifier circuit and which supplies a certain signal to said time constant circuit.

5. In an FM detector circuit of a pulse count system wherein trigger pulses synchronous with phases of respective periods of an FM modulation signal are impressed on a trigger input terminal of a monostable multivibrator, thereby to form pulses of a fixed width which are generated in sychronism with the phases of the respective periods of the FM modulation signal, with said pulses being integrated by a filter circuit thereby to demodulate a desired signal, wherein the monostable multivibrator comprises:
    a time constant circuit which includes a capacitor;
    a differential amplifier which is made up of a pair of transistors connected in a differential form and whose emitters are connected in common with each other, the base of one of the pair of transistors being supplied with an output from said time constant circuit while a base of the other of the pair of transistors being supplied with a reference voltage so that the pair of transistors performs switching operation between "on" state and "off" state, a positive feedback circuit which is coupled between a collector of either of said pair of transistors of said differential amplifier and an input end of said time constant circuit; and trigger input means for supplying the trigger pulses, said means being coupled to a circuit loop which is constructed of said time constant circuit, said differential amplifier and said positive feedback circuit; the improvement comprising emitter resistances for decreasing the gain of said differential amplifier inserted between the junction of the common coupling and the respective emitters of said pair of transistors.

* * * * *